(12) United States Patent
Agarwal et al.

(10) Patent No.: US 7,205,798 B1
(45) Date of Patent: Apr. 17, 2007

(54) PHASE ERROR CORRECTION CIRCUIT FOR A HIGH SPEED FREQUENCY SYNTHESIZER

(75) Inventors: Sandeep Agarwal, Fremont, CA (US); Xiaole Chen, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/045,929

(22) Filed: Jan. 28, 2005

Related U.S. Application Data

(60) Provisional application No. 60/575,667, filed on May 28, 2004.

(51) Int. Cl.
   *H03B 21/00* (2006.01)
(52) U.S. Cl. .................... 327/105; 327/107
(58) Field of Classification Search ........ 327/105–107, 327/159; 708/101, 271, 276
   See application file for complete search history.

(56) References Cited

U.S. PATENT DOCUMENTS

| | | | |
|---|---|---|---|
| 4,185,247 A * | 1/1980 | Harrison, Jr. ............... | 327/107 |
| 4,410,954 A * | 10/1983 | Wheatley, III .............. | 708/101 |
| 4,791,378 A * | 12/1988 | Waltham .................... | 327/156 |
| 4,933,890 A * | 6/1990 | Nuytkens et al. ........... | 708/276 |
| 5,394,106 A * | 2/1995 | Black et al. ................ | 327/107 |
| 5,905,388 A * | 5/1999 | Van Der Valk et al. ..... | 327/107 |
| 6,353,649 B1 * | 3/2002 | Bockleman et al. ........ | 375/376 |
| 6,642,754 B1 * | 11/2003 | Dobramysl et al. ......... | 327/105 |
| 6,748,407 B1 * | 6/2004 | Oga .......................... | 708/271 |
| 6,960,947 B2 * | 11/2005 | Albasini et al. ............ | 327/147 |
| 7,026,846 B1 * | 4/2006 | Huntley et al. ............. | 327/105 |

* cited by examiner

*Primary Examiner*—Kenneth B. Wells
(74) *Attorney, Agent, or Firm*—Townsend and Townsend and Crew LLP; J. Matthew Zigmant

(57) ABSTRACT

Circuits, methods, and apparatus for reducing the phase error in an NCO clock output to reduce the clock jitter. This is particularly beneficial where the frequencies of the NCO output and reference signal are unrelated. One embodiment provides a circuit that corrects the phase of the NCO output in two steps in order to obtain a substantially glitch-free, high-speed operation. During the first step, the output of the NCO is phase shifted to the closest quarter portion of a cycle of a clock signal. A second correction step is then performed by steering a number of currents under the control of at least some of a number of remainder bits from the NCO. The current steering provides a die area efficient, low-noise phase correction. The decoded remainder bits are latched using a feed forward circuit that prevents the device from entering a locked state.

20 Claims, 17 Drawing Sheets

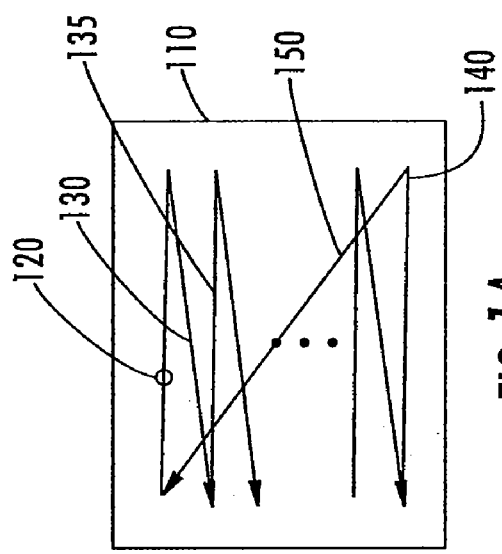
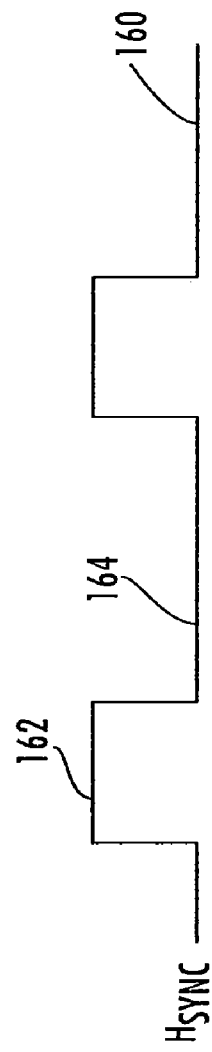
FIG. 1A (PRIOR ART)
FIG. 1B (PRIOR ART)

PHASE ERROR CORRECTION CIRCUIT FOR A HIGH SPEED FREQUENCY SYNTHESIZER

BACKGROUND

The present invention relates generally to digital phase-locked loops, and more specifically to analog phase error correction circuits for high speed frequency synthesizers used in digital phase-locked loops.

Digital phase-locked loops (DPLLs) are used in a wide array of applications. A specific example is the use of DPLLs to generate pixel clocks in video applications. These clock signals synchronize data displayed on flat panel displays such as liquid crystal displays (LCD), and other types of monitors, as well as LCD and plasma televisions, projectors, and other types of display apparatus. A DPLL in this type of application typically receives a horizontal synchronizing signal (HSYNC) and a divide ratio, and divides the HSYNC signal period by the divide ratio to generate a pixel clock.

DPLLs include a numerically controlled oscillator (NCO), which may be used to generate the pixel clock. An NCO receives a clock signal and phase increment information, and accumulates the phase increment information each clock signal. The accumulated phase information can be used to find an entry in a look-up table, the entries of which typically correspond to a sinewave. The look-up table provides an output each NCO clock cycle. These outputs form a digitized sinewave, the frequency of which depends on phase increment information. This sinewave can then be filtered and used as a pixel clock.

The accumulated phase information includes an overflow and a remainder signal. This overflow signal is typically a one bit signal that may alternately be used as the pixel clock. The overflow signal has a frequency that also depends on the phase increment information. Pixel clocks generated this way have an associated jitter of one NCO clock cycle period caused by a phase error that accumulates over a number of pixel clock cycles. Thus, additional circuitry for adjusting the phase of the overflow signal is needed to reduce this phase error.

Unfortunately, conventional methods of making this adjustment are either not very accurate or often multiplex multiple clock lines that cause high switching noise and consume a large amount of power and die area. Thus what is needed are circuits, methods, and apparatus that reduce or remove this phase error in such a way that the synthesized pixel clock has high accuracy and low jitter and noise.

SUMMARY

Accordingly, embodiments of the present invention provide circuits, methods, and apparatus that adjust a clock signal provided by an NCO in order to provide an output signal that is phase-locked to a reference signal. This is particularly beneficial where the frequencies of the NCO and reference signal are unrelated.

One exemplary embodiment of the present invention provides a circuit that corrects the phase of a signal provided by an NCO in two steps. During the first, the output of the NCO is phase shifted to the closest correct potion of a cycle of a clock signal. In one specific embodiment, the NCO output is phase shifted to the closest quarter of a clock cycle to the correct position. This is followed by a second more accurate correction, for example, a correction to one sixty-fourth of a clock cycle in this embodiment. Performing the first correction before the second reduces or eliminates the possibility of glitches occurring during phase correction.

In one exemplary embodiment, this second correction is performed by a number of current steering circuits. This provides a die area efficient, low-noise phase correction. These currents are steered by a decoded version of at least some of a number of remainder bits from the NCO. The decoded remainder bits are latched using a feedforward circuit that prevents a locked state from occurring. Various embodiments of the present invention may make use of any or all of these or the other features described herein.

A better understanding of the nature and advantages of the present invention may be gained with reference to the following detailed description and the accompanying drawings.

BRIEF DESCRIPTION OF THE DRAWINGS

FIG. 1A illustrates a scan line pattern for a display device, while

FIG. 1B illustrates a horizontal synchronizing signal used in generating the scan line pattern.

DESCRIPTION OF EXEMPLARY EMBODIMENTS

Figure 1C:
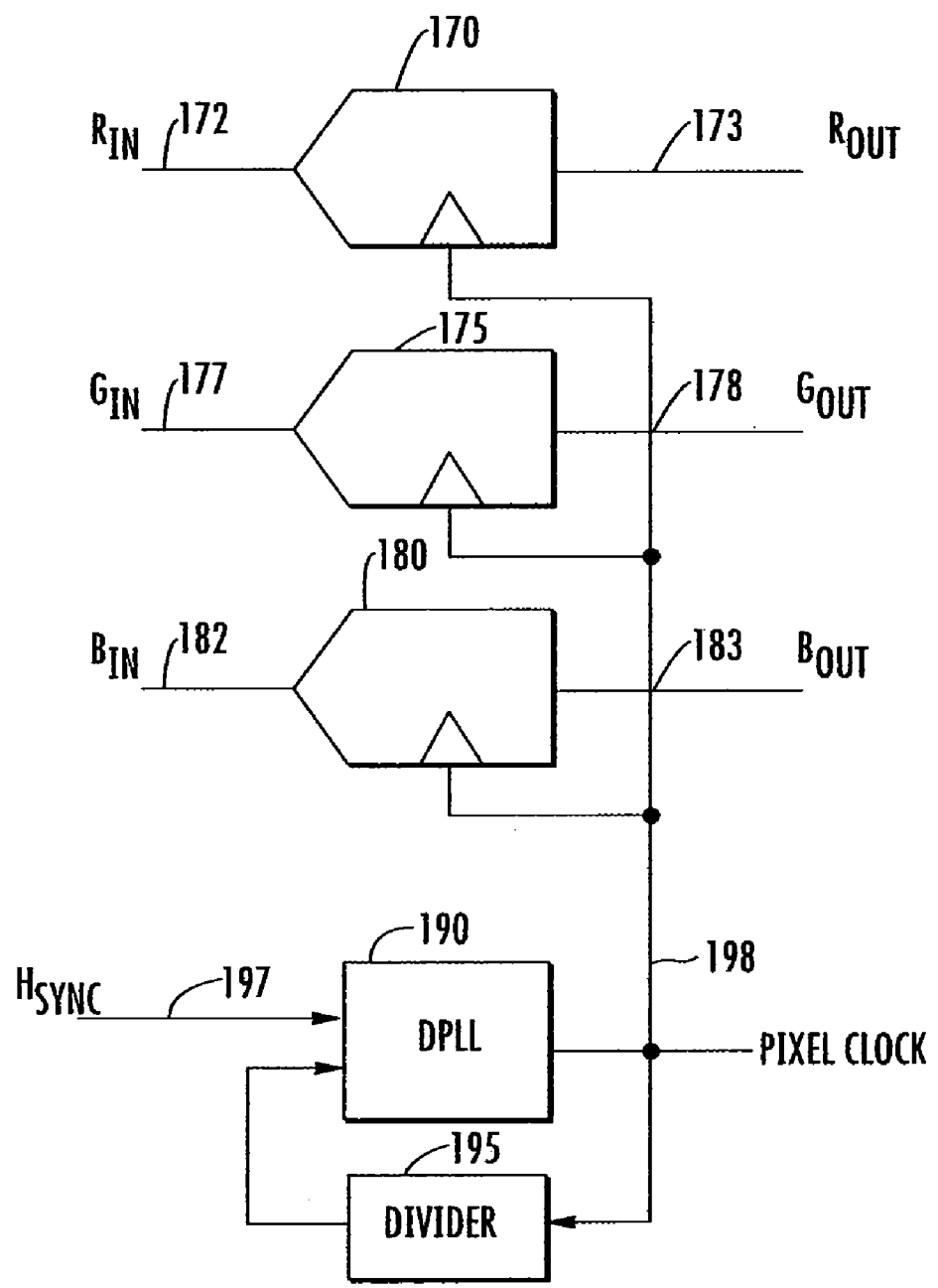
FIG. 1C illustrates a portion of a digital display system that may be improved by embodiments of the present invention.

FIG. 1A illustrates a scan line pattern for a digital display device. This figure includes a display screen 110 that may be a screen for a digital display such as a computer monitor, including LCD monitors, televisions such as plasma, digital, high definition, advanced, and other types of televisions, and projectors, such as front and rear end projectors, digital light projectors, and other types of projectors. These screens include a number of pixels, the illumination of which is controlled by digital signals. These digital signals update the pixels in a pattern that follows the scan line pattern 120, or similar scan line. This pattern typically includes a number of horizontal lines 130 each followed by a horizontal retrace 135. When the scan line reaches the end or bottom of the monitor 140, a vertical retrace 150 occurs.

During each horizontal scan line 130, the a number of individual pixels located along the line 130 are updated. Typically, each pixel includes red, green, and blue components. An image on the display screen 110 is generated by the digital signals (which may be converted to an analog signal first) controlling the illumination of each of these pixels.

To generate a quality image on the display screen 110, it is desirable that pixel information be timed properly to maintain alignment between the pixel information and the individual pixels during the scan pattern. Accordingly, accurate timing for the pixel information is needed. Thus, an accurate pixel clock that synchronizes the transfer of data such that the image is aligned to the individual pixels on the display screen 110 is provided by an exemplary embodiment of the present invention.

FIG. 1B illustrates a horizontal synchronizing signal, HSYNC, used in generating the scan line pattern 120 in FIG. 1A. During each horizontal retrace 135, HSYNC 160 is high, for example, pulse 162. When the image is being generated, HSYNC 160 is inactive, for example pulse 164. During pulse 154, a set number of pixels on scan line 130 need to be driven. Accordingly, it is a desirable to synchronize the pixel clock to the HSYNC signal 160.

FIG. 1C illustrates a portion of a digital display system that may be improved by the incorporation of embodiments of the present invention. Included are digital circuits 170, 175, and 180, DPLL 190 and divider 195. Intensity information for red, green, and blue are received on lines 172, 177, and 182 from one of a number of sources such as a set-top box, satellite receiver, DVD player, DVR, or other video source. The intensity information is processed by digital circuits 170, 175, and 180 and provided to a display device.

A horizontal synchronizing signal HSYNC is received on line 197 by the DPLL 190. The DPLL 190 generates a pixel clock on line 198 that is used to control the timing of the pixel information provided to the display device. The pixel clock is divided by the divider 195 and provided to the DPLL 190. The DPLL 190 acts to provide a pixel clock on line 198 having the correct phase and frequency such that pixel information is properly aligned on the display screen 110.

Figure 2:
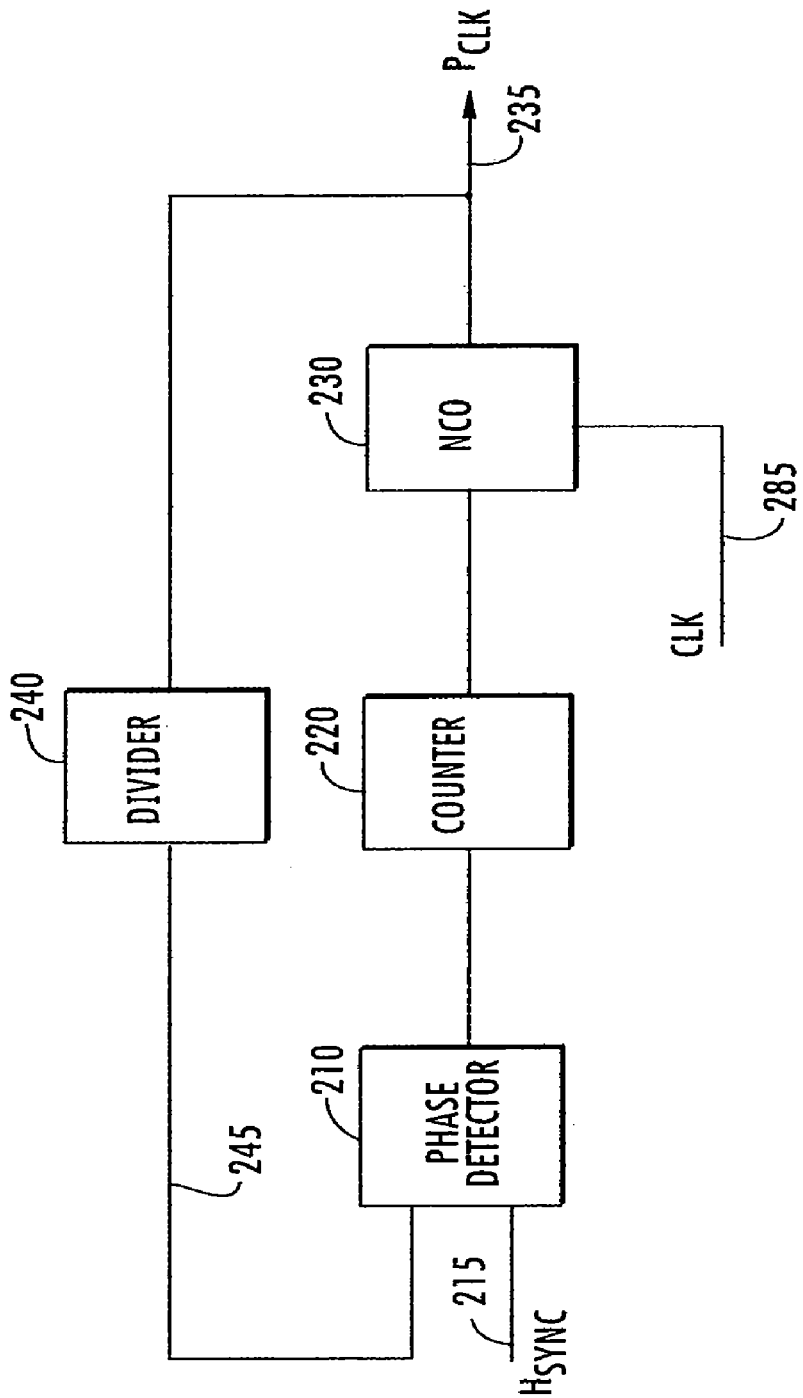
FIG. 2 illustrates a DPLL that may be improved by incorporating embodiments of the present invention.

FIG. 2 illustrates a DPLL that may be improved by incorporating embodiments of the present invention. This DPLL includes a phase detector 210, counter 220, NCO 230, and divider 240. This figure, as with all the included figures, is shown for illustrative purposes only and does not limit either the possible embodiments of the present invention or the claims.

Phase detector 210 receives an output signal from the divider 240 on line 245 and a horizontal synchronizing signal HSYNC on line 215. The phase detector compares the relative phase of these two signals and provides an output to the counter 220. The counter 220 increments the NCO 230 by an amount that is proportional to the phase difference between the signals received by the phase detector 210. The NCO 230 is clocked by a clock signal on line 225. The NCO 230 may further include other circuitry such as a digital to analog converter (DAC) and filter (not shown).

The NCO 230 provides a pixel clock PCLK on line 235. PCLK may be used to time pixel information provided to a digital display such as display screen 110. The divider 240 receives PCLK on line 235 and provides a divided output on line 245 to the phase detector 210. The divider 240 also receives a divided ratio, for example a ratio indicating how many PCLK clock cycles occur in each HSYNC cycle 215.

In this way, the NCO 230 provides a signal PCLK on line 235 that has a known relationship to HSYNC on line 215. Again, this is useful in clocking pixel information to the display 110. However, the NCO 230 is clocked by the clock signal on line 225, and the clock signal on line 225 may not have a set relationship to the HSYNC signal on line 215.

Because of this, the PCLK signal on line 235 has a quantization error of one clock cycle of the clock signal on line 225. Thus, some PCLK clock cycles are longer by a duration that is equal to one clock cycle (or one-half a clock cycle) of the clock signal on line 225. Thus, what is needed is an adjustment circuit for the NCO that skews the edges of the PCLK signal such that all PCLK clock edges are equally spaced.

Figure 3:
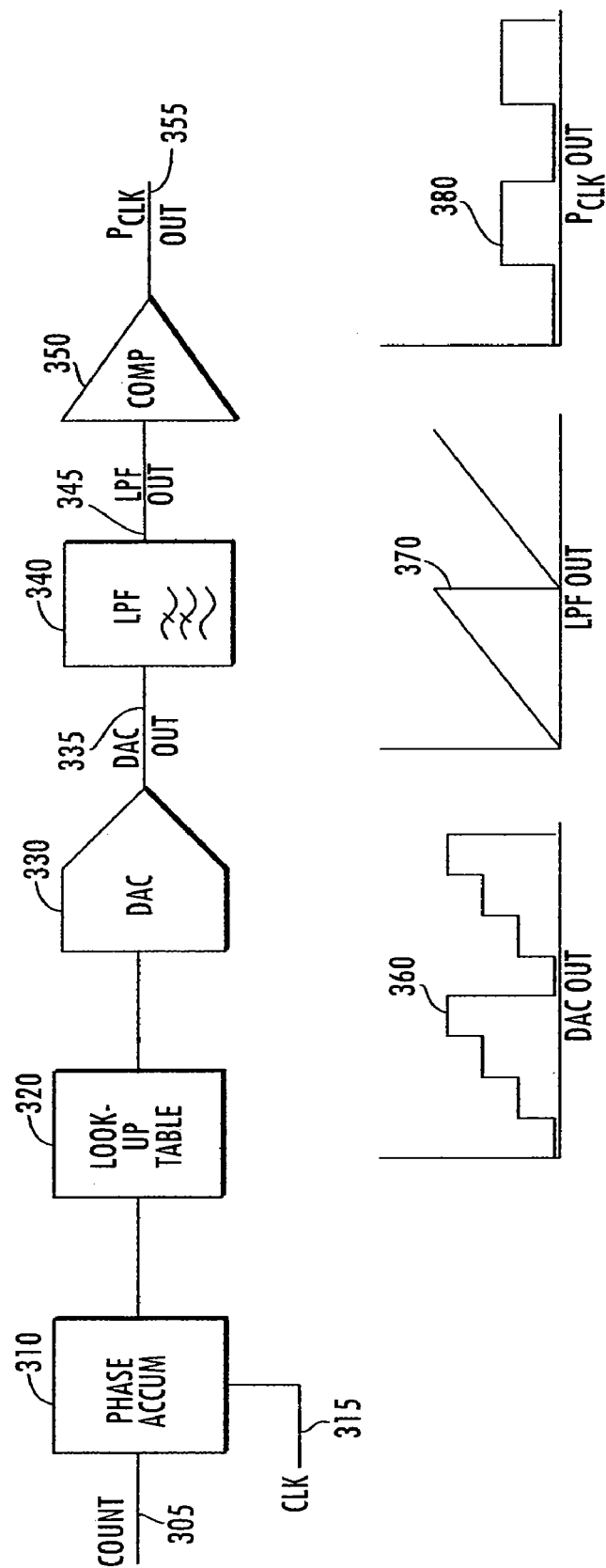
FIG. 3 illustrates a conventional circuit for using an NCO to generate a pixel clock signal.

FIG. 3 illustrates a conventional circuit utilizing an NCO to generate a pixel clock signal. This circuit includes a phase accumulator 310, lookup table 320, DAC 330, low-pass filter 340, and comparator 350. The phase accumulator 310 and lookup table 320 comprise the NCO itself, while the remaining circuits convert the NCO output to a pixel clock output on line 355.

The phase accumulator 310 receives a count on line 305 that is typically proportional to phase increment information from a phase detector, as shown in FIG. 2. The output of phase accumulator 310 is translated to an entry in the lookup table 320, which typically contains a digitized sinewave. The output of the lookup table 320 is converted to an analog signal by the DAC 330, the output of which is filtered by low-pass filter 340. The output of the low-pass filter 340 is bit-sliced by comparator 350 in order to generate the pixel clock output on line 355.

Waveform 360 represents a simplified signal at the DAC output on line 335. Waveform 370 illustrates an idealized output of the low-pass filter on line 345, while waveform 380 illustrates the pixel clock output on line 355.

The phase accumulator 310 is clocked by a clock signal on line 315. A problem arises since the NCO clock signal on line 315 is not necessarily a harmonic of the pixel clock output on line 355. Accordingly, some pixel clock output clock cycles are longer than others by a duration corresponding to one clock cycle of the clock signal on line 315. Again, what is needed are phase error circuits to adjust the edges of the pixel clock output on line 355.

Figure 4:
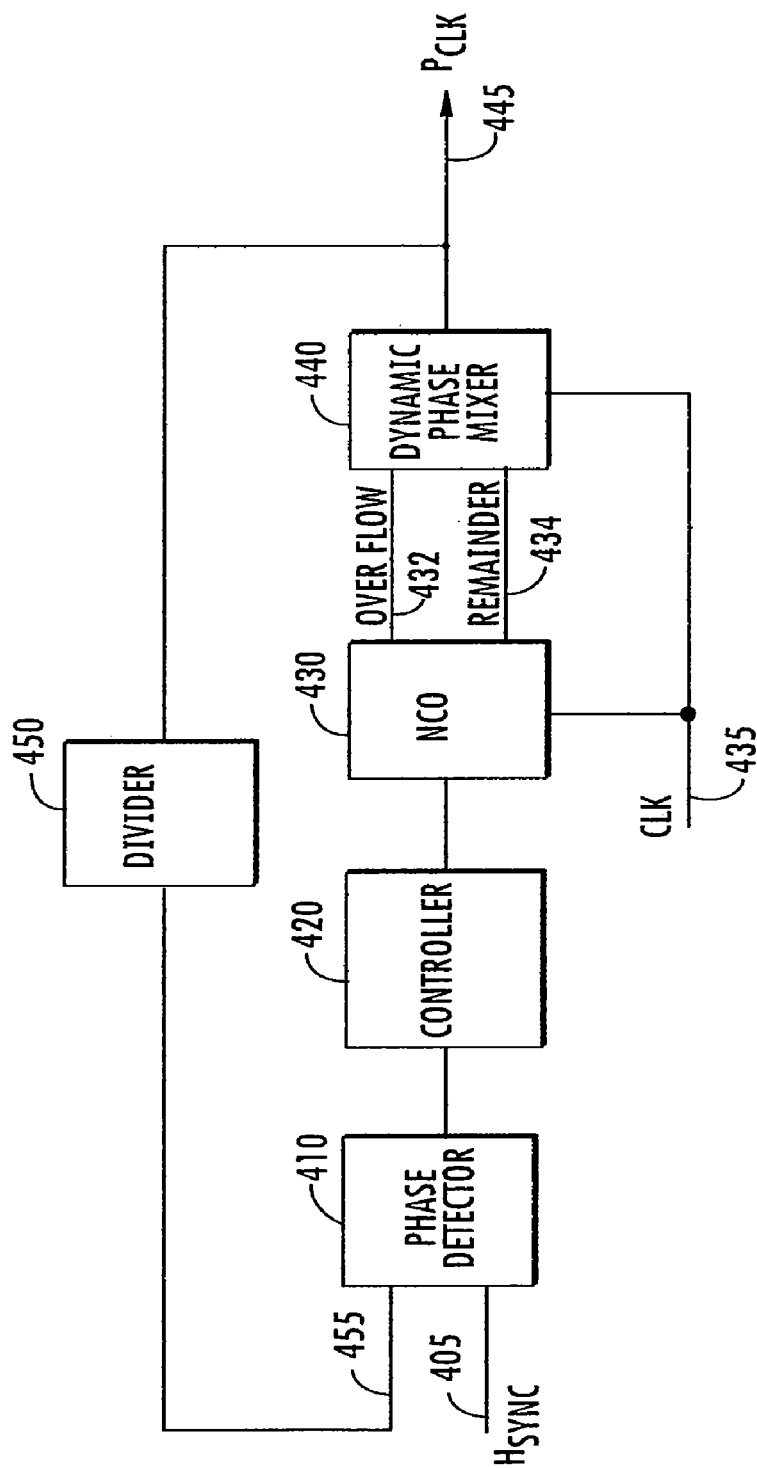
FIG. 4 is a block diagram of a DPLL according to an embodiment of the present invention.

FIG. 4 is a block diagram of a DPLL according to an embodiment of the present invention. This block diagram includes a phase detector 410, controller 420, NCO 430, dynamic phase mixer 440, and divider 450. As before, the phase detector 410 compares the relative phase of the horizontal synchronizing signal HSYNC on line 405 with the output of the divider 450. The phase detector then provides a signal proportional to this phase difference to the controller 420. The controller 420 provides an increment count to the NCO 430.

The NCO 430 provides an overflow signal on line 432 and a remainder signal 434 to the dynamic phase mixer 440. The overflow signal on line 432 is similar to a pixel clock provided by the prior art in that it has a quantization error of one cycle of the clock signal received on line 435. The remainder on lines 434 is essentially phase information, that is, the remainder 434 contains information as to the phase error of the overflow signal on line 432.

The dynamic phase mixer 440 receives the overflow signal on line 432 and remainder signals on line 434, and adjusts the overflow signal on line 432 using the phase information of the remainder signal on lines 434 to provide a phase corrected pixel clock PCLK on line 445. The PCLK signal on line 445 is divided by the divider 450 and provided on line 455 back to the phase detector 410.

Typically, if the phase detector 410 receives an HSYNC edge before it receives a corresponding edge of the divider 450 output, the controller 420 provides a smaller count to the NCO 430 such that the period of the PCLK signal on line 445 is reduced. This increase in frequency advances edges of the divider 450 output into alignment with the edges of the HSYNC signal on line 405.

In some embodiments of the present invention, the NCO 430 and dynamic phase mixer 440 are used in an open-loop configuration without a divider 450, phase detector 410, and controller 420. In one such configuration, a increment signal is provided directly to the NCO 430.

Figure 5:
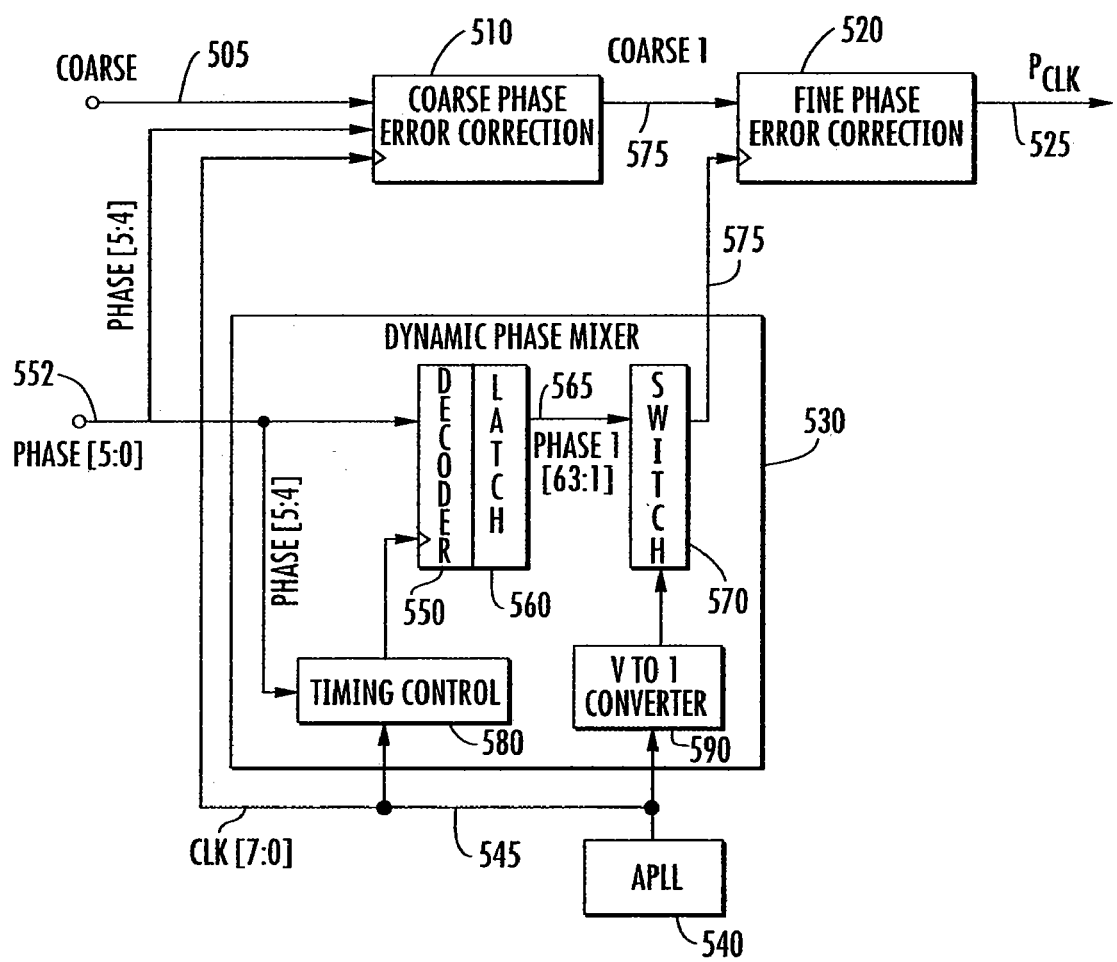
FIG. 5 is a block diagram of a dynamic phase mixer and associated circuitry according to an embodiment of the present invention.

FIG. 5 is a block diagram of a dynamic phase mixer and associated circuitry according to an embodiment of the present invention. This figure includes a first or coarse phase error correction circuit 510 followed by a fine phase error correction circuit 520, as well as a dynamic phase mixer 530, and analog phase-locked loop (PLL) 540. The dynamic phase mixer 530 includes a decoder 550, latch 560, switch 570, timing control circuit 580, and voltage-to-current converter 590.

A coarse or overflow signal is received from an NCO on line 505 by the coarse phase error correction circuit 510. The coarse phase error correction circuit 510 also receives the top two bits of the remainder or phase signal from the NCO on lines 552, as well as clock signals from the phase-locked loop 540 on lines 545. The coarse phase error correction 510 retimes the edges of the coarse signal on line 505 to the closest one-quarter cycle of the clock signals provided by the PLL 540.

The dynamic phase mixer receives six bits of phase information on lines 552 and the clock signals on lines 545 from the phase-locked loop and provides a retiming signal on line 575 to the fine phase error correction circuit 520. The fine phase error correction circuit 520 receives the coarse corrected signal on line 515 from the first coarse phase error correction circuit 510 as well as the retiming signal on line 575 from the dynamic phase mixer, and provides a pixel clock output PCLK on line 525.

The dynamic phase mixer decodes six bits of remainder or phase error signal received on lines 552 into 64 signals, which are latched by latches 560. The timing of the decoder 550 is controlled by the timing control circuit 580, which receives the top two bits of the remainder or phase error signal on lines 552. The timing control circuit latches the phase information on lines 552 at the proper time to update the 64-bit switch control signal on line 565.

The phase-locked loop 540 provides eight clocks, each separated by 45 degrees, on lines 545. These clock signals may be generated using a ring oscillator or other appropriate structure. The voltage to current converter 590 in the dynamic phase mixer 530 converts these singles to currents and provides them to the switch 570. The switch 570 switches these currents under control of the decoded phase information on lines 565, which are provided by the latch 560, to generate a current having one out of a number (64 in a specific embodiment) of possible phases, and converts this current into a voltage. This voltage is provided on line 575 as a retiming signal to the phase error correction circuit 520.

Figure 6:
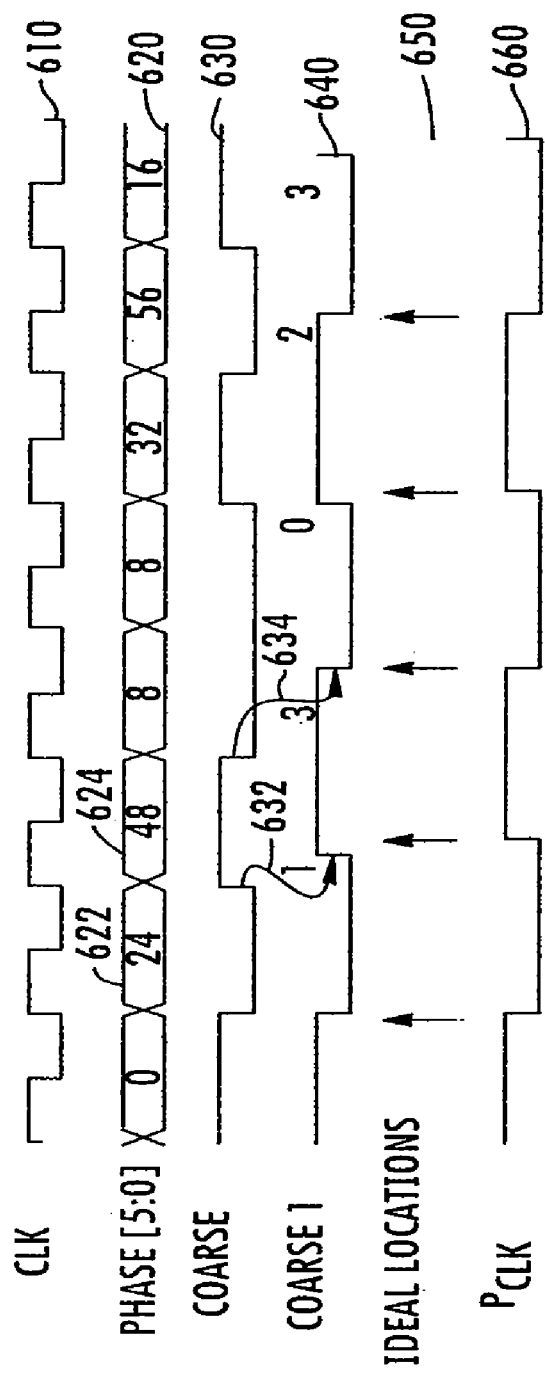
FIG. 6 illustrates the timing of several signals of the block diagram of FIG. 5.

FIG. 6 illustrates the timing of several signals of the block diagram of FIG. 5. This timing diagram includes signals CLK 610 (the clock signal received by the NCO), phase error signals 620, and a coarse or overflow signal 630. The phase error signals 620 are used to realign the edges of the coarse signal 630 to the closest ideal quarter cycle of the CLK signal 610. For example, the remainder or phase error bits 620 have a decimal value of 24. The top two bits of this value are "01," which results in the corresponding rising edge of the coarse signal 630 being delayed by a duration equal to one quarter cycle of CLK 610 as indicated by phase shift 632. Similarly, the remainder or phase error bits 624 have a value of 48. The top two bits of this value are "11," meaning that the next falling edge of the coarse signal 630 is delayed three quadrants, as is indicated by phase shift 634.

Arrows 650 indicate the ideal locations for the rising and falling edges of the pixel clock signal PCLK 660. The fine or second phase error correction circuitry further adjusts the edges of the coarse1 signal 640 in order to generate the pixel clock signal PCLK 660.

It will be appreciated by one skilled in the art that the circuit shown in FIG. 5 maybe redrawn in a different number of ways. That is, the circuitry in FIG. 5 is separated into various functional blocks for explanatory purposes, but may be separated into different functional blocks, for example, to highlight different aspects of the circuitry. As one example, the circuitry of FIG. 5 can be redrawn as shown in FIG. 7.

Figure 7:
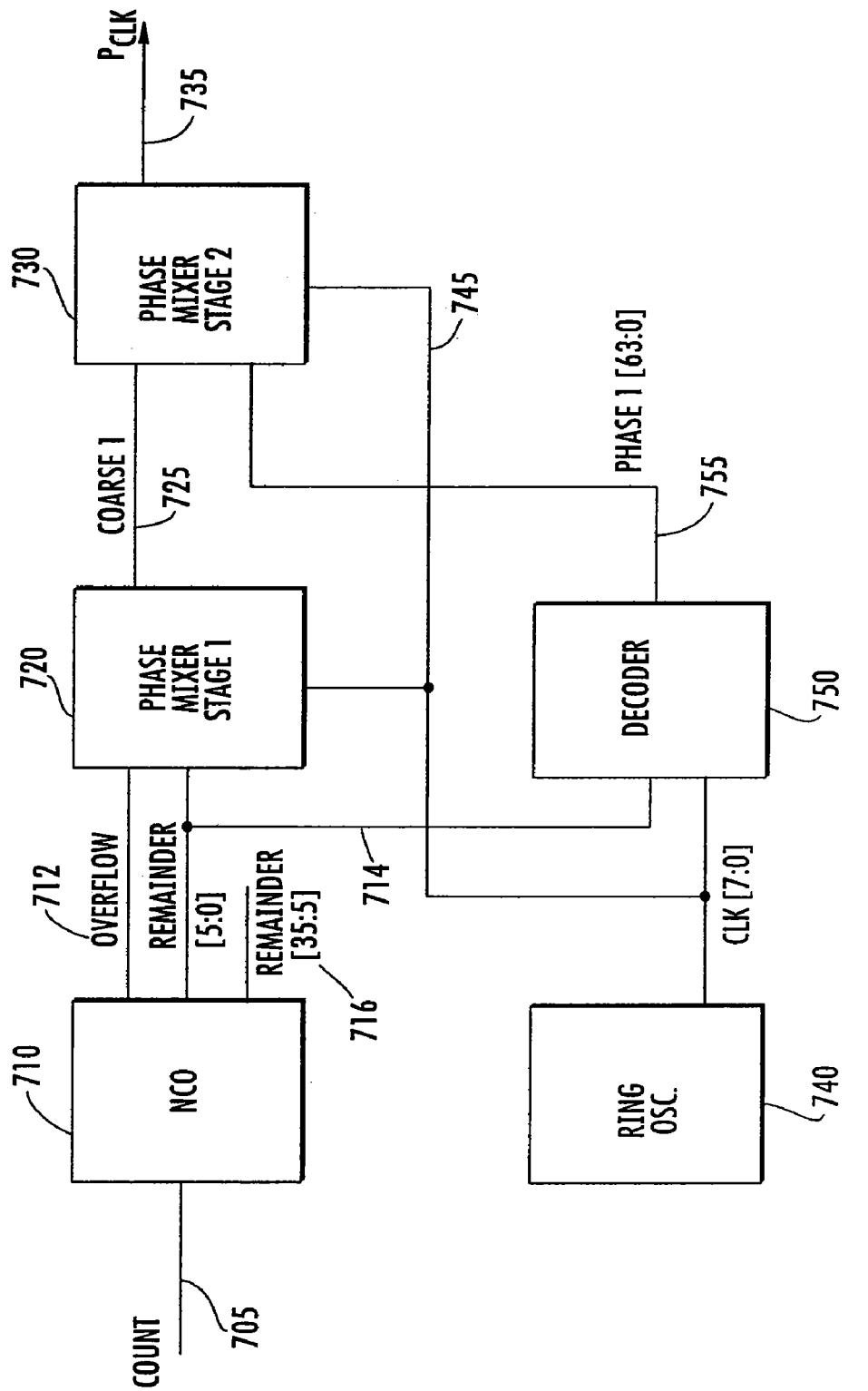
FIG. 7 is an alternate block diagram of a dynamic phase mixer and associated circuitry according to an embodiment of the present invention.

FIG. 7 is an alternate block diagram of a dynamic phase mixer and associated circuitry according to an embodiment of the present invention. This block diagram includes an NCO 710, phase mixer stage 1 720, phase mixer stage 2 730, ring oscillator 740, and decoder 750. As before, the NCO 710 receives an incremental count on lines 705. The NCO provides and overflow signal 712 that may be used as a coarse clock signal. The NCO 710 also provides 36 bits of remainder. In one embodiment, bits [35:6] are not used, while bits [5:0] are used as phase information to correct the location of the edges of the coarse or overflow signal. The phase mixer stage 1 720 receives the overflow or coarse signal and at least some of the bits of the remainder signal. As shown before, a specific embodiment of the present invention receives two bits of phase error signal. The phase mixer stage 1 retimes the overflow or coarse signal to the closest ideal quadrant of the clock signals provided on lines 745 in order to generate the coarse1 signal on line 725. The ring oscillator 740 may be part of an analog phase-locked loop and provides clock signals to the decoder and phase mixer stages on lines 745.

The decoder 750 receives the remainder or phase error information from the NCO 710 and decodes it into 64 bits on lines 755. The phase mixer stage 2 730 receives the coarse1 signal from the phase mixer stage 1 720, the decoded phase information on lines 755 from the decoder 750, and the clock signals from the ring oscillator 740 on lines 745, and provides a retimed pixel clock PCLK on line 735.

Figure 8:
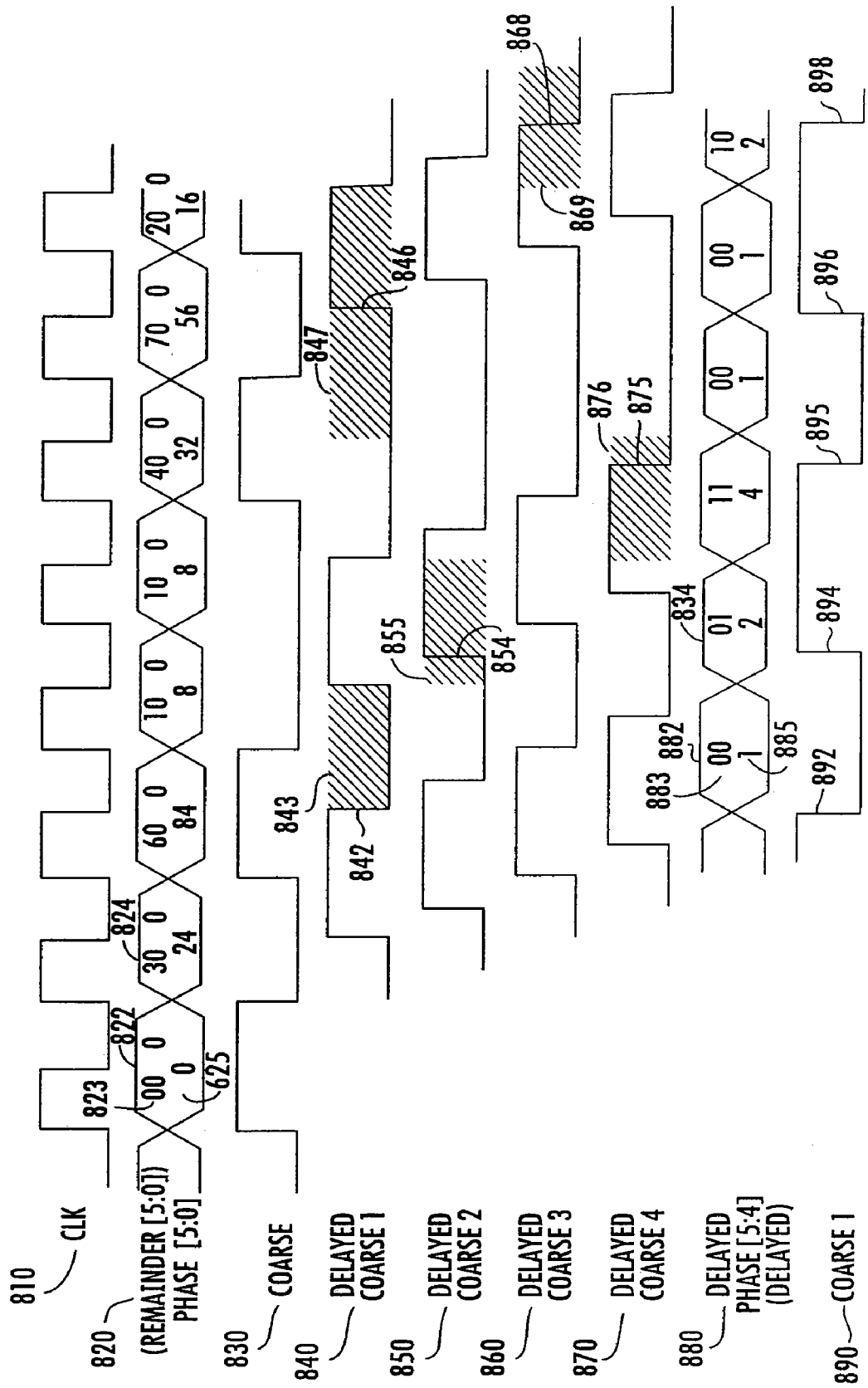
FIG. 8 illustrates the timing of the first stage of the phase mixer of FIG. 7.

FIG. 8 illustrates the timing of the first stage of the phase mixer of FIG. 7. Included are one of the eight clock signals, the clock signal having a phase shift of zero, CLK 810, which is the same as CLK[0] of 745, six bits of remainder or phase error signal 820 which is the same as 714, the coarse or overflow signal 830 which is the same as 712. The delayed coarse signals 840, 850, 860, and 870, delayed phase error information 880 are internal to 720 in FIG. 7, and coarse1 signal 890, which is the same as 725. Again, the function of the first stage of the phase mixer of FIG. 7 is to realign the edges of the coarse or overflow signal 830 to the quadrants of the clock signal 810 that is closest to their ideal position.

The coarse or overflow signal 830 is delayed an amount of time that is dependent on the particular architecture implemented, and then provided as the delayed coarse1 signal 840. Subsequent versions of the signal are each delayed a quarter of the clock signal 810, and provided as delayed coarse 2 850, delayed coarse 3 860, and delayed coarse 4 870.

The phase information phase[5:4] provides delayed phase signal 880. The top two bits are used in selecting one of the four delayed coarse signals to generate coarse1 890.

Specifically, delayed phase bits 882, having a binary value "00," are used to select delayed coarser signal 840 during pulse 882, which results in the falling edge 892 of coarser 890. Similarly, delayed phase bits 884, having a binary value "01," are used to select delayed coarse 2 signal 850 during pulse 850, which results in the rising edge 894 of the coarse1 signal 890. In the same way, signals delayed coarse 4 870 then delayed coarse 1 840 are selected, resulting in edges 895 and 896 of coarse1 890. Shaded areas 843, 855, 876, 847, and 868 illustrate which of the delayed coarse signals are selected at which time to generate the coarse1 signal 890.

Figure 9:
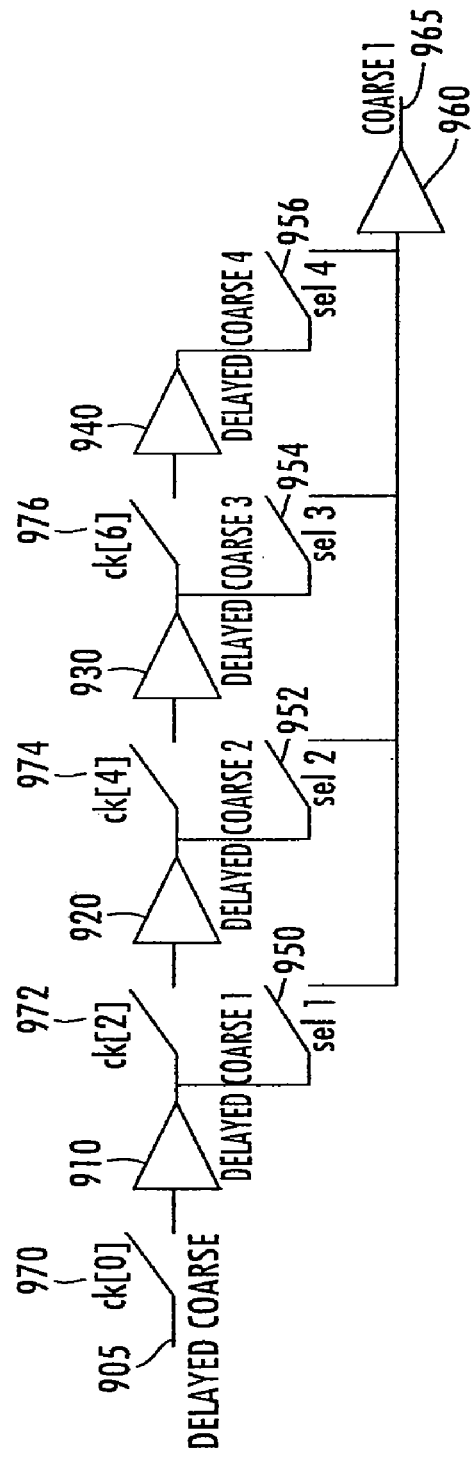
FIG. 9 is a block diagram of some of the circuitry included in the first stage of the phase mixer of FIG. 7.

FIG. 9 is a block diagram of some of the circuitry included in the first stage of the phase mixer of FIG. 7. Included are buffers 910, 920, 930, 940, and 960. A delayed coarse signal is received on line 905 and delayed by the subsequent sampling switches controlled by different clock phases. The outputs of these buffers, 910, 920, 930, and 940 are selected by switches 950, 952, 954, 956, and provided to buffer 960. The buffer 960 provides the coarser signal on line 965. In a specific embodiment of the present invention, the select signals are decoded versions of the top two bits of the phase error or remainder signal provided by the NCO.

Figure 10:
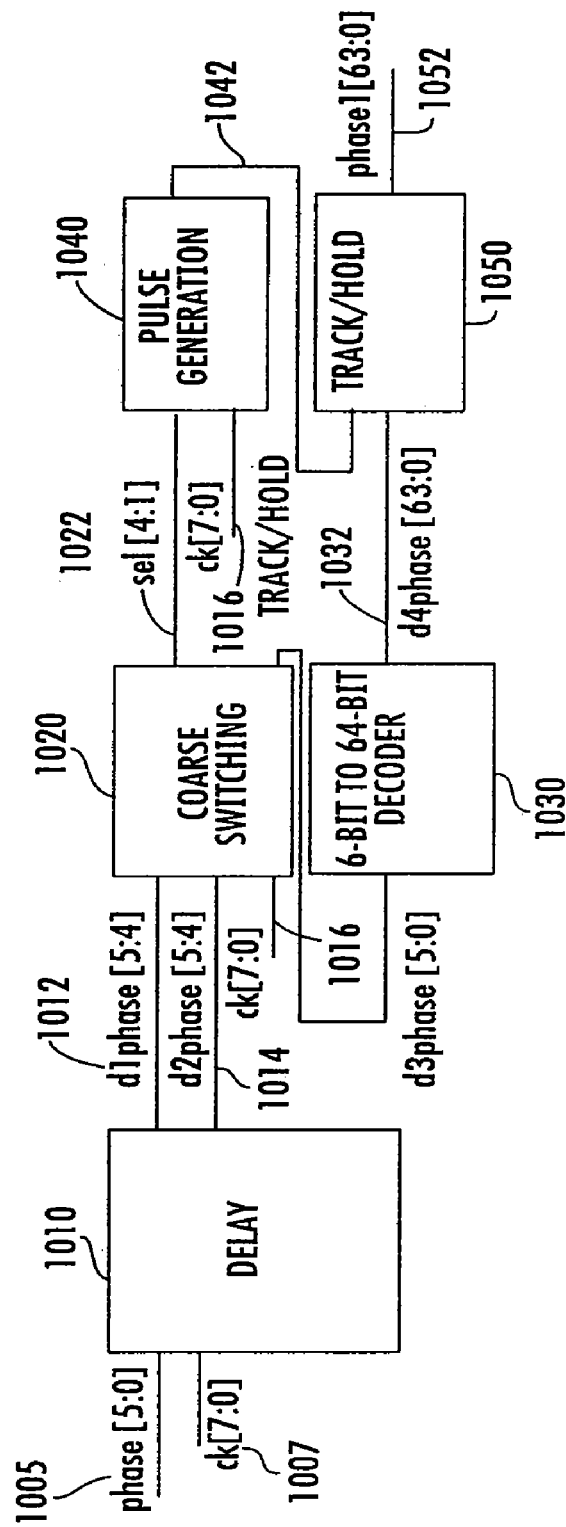
FIG. 10 is a block diagram of a decoder that may be used as the dynamic phase mixer in FIG. 5 or 7 or other embodiments of the present invention.

FIG. 10 is a block diagram of a dynamic phase mixer that may be used as the dynamic phase mixer in FIG. 5 or 7 or other embodiments of the present invention. This decoder includes a delay circuit 1010, coarse switching circuit 1020, 6-bit to 64-bit decoder 1030, pulse generation circuit 1040, and track and hold circuit 1050. The delay circuit 1010 receives the phase or remainder bits phase [5:0] on line 1005, and the clock signals CLK[7:0] from a PLL or other clock source on lines 1007. The delay circuit 1010 provides delayed phase signals on lines 1012 and 1014 to the coarse switching circuit 1020, and on line 1018 to the 6-bits to 64-bit decoder 1030.

The coarse switching circuit 1020 generates four select signals on lines 1022 and provides them to the pulse generation circuit 1040. The pulse generation circuit 1040 receives the select lines and the clock signals and provides a track and hold signal on line 1042 to the track and hold circuit 1050. The track and hold circuit 1050 receives the track and hold signal on line 1042 and the decoded phase signals online 1032, and provides retimed, decoded phase signals phase1[63:0] on lines 1052.

Figure 11:
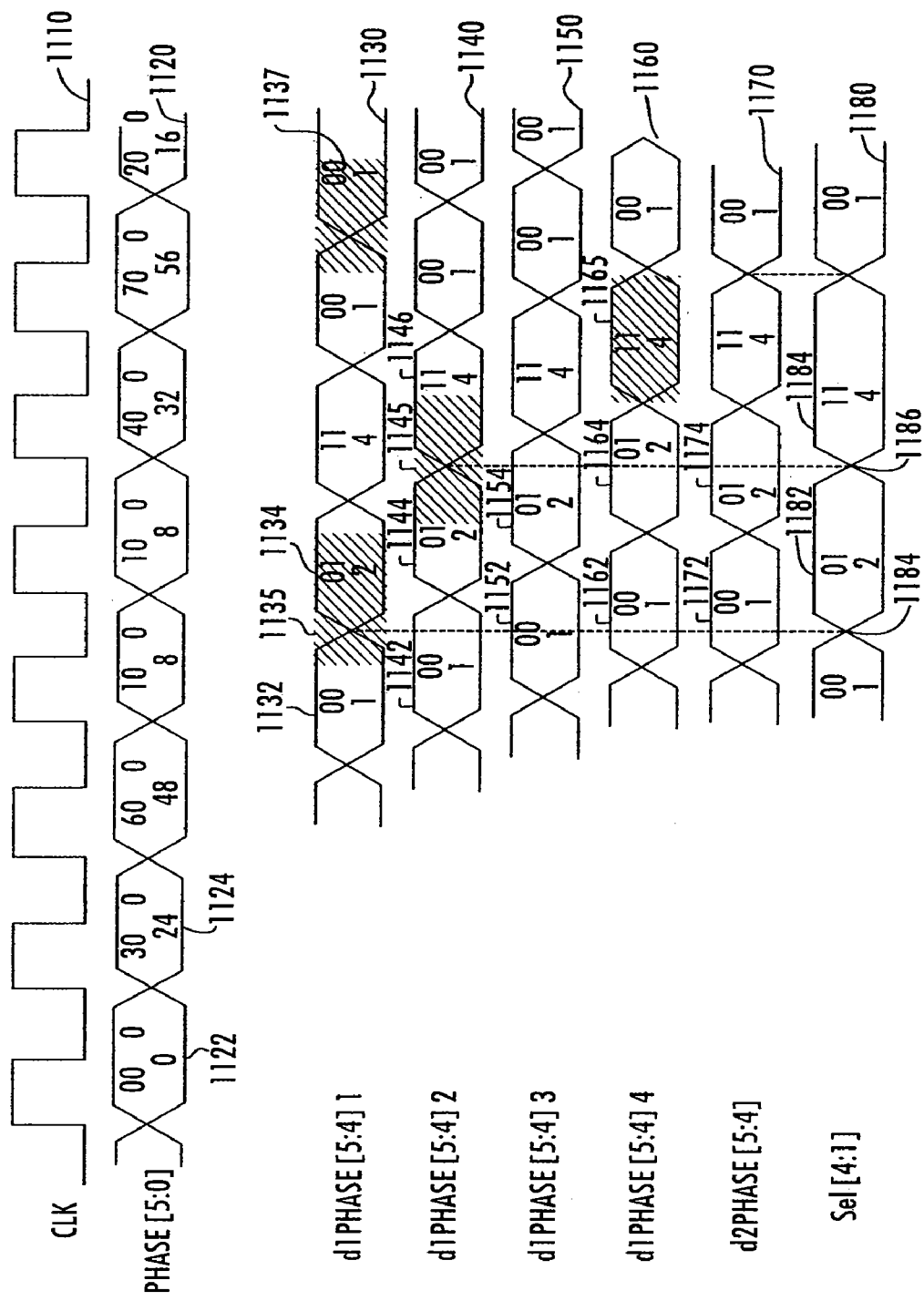
FIG. 11 is a timing diagram of a portion of the dynamic phase mixer of FIG. 10.

FIG. 11 is a timing diagram of a portion of the dynamic phase mixer of FIG. 10. Specifically, the timing for the delay 1010 and coarse switching circuits 1020 is shown. The delay circuit 1010 in the decoder receives the NCO clock signal 1110 and the remainder or phase error bits 1120. The delay circuit provides delayed versions of the top two remainder bits, specifically d1phase1 1130, d2phase2 1140, d3phase3 1150, and d1phase4 1160. The delay between each delayed one from its previous version is one-quarter of an NCO clock period. The delay circuit also provides another delayed version of the top two bits, d2phase 1170, which identical to d1phase4 1160.

D2phase 1170 is used to select from among the d1phase1–4 signals to generate a two-bit select word out[1:0] (not shown). The select lines SEL[4:1] 1180 are the decoded version of this two bit select word out[1:0]. Specifically, at time 1172, the state of d2phase 1170 is "00" binary. Accordingly, at that time, d1phase1 is selected. When the selection word out[1:0] switches to state "01," d1phase1 is selected as the signal out[1:0]. Similarly, when d2phase signal 1170 is "11," D1phase4 is selected as the signal out[1:0]. Shaded areas 1135, 1145, 1165, and 1137 indicate which of the d1phase signals are selected at various times to generate the select signal SEL[4:1] 1180.

Figure 12:
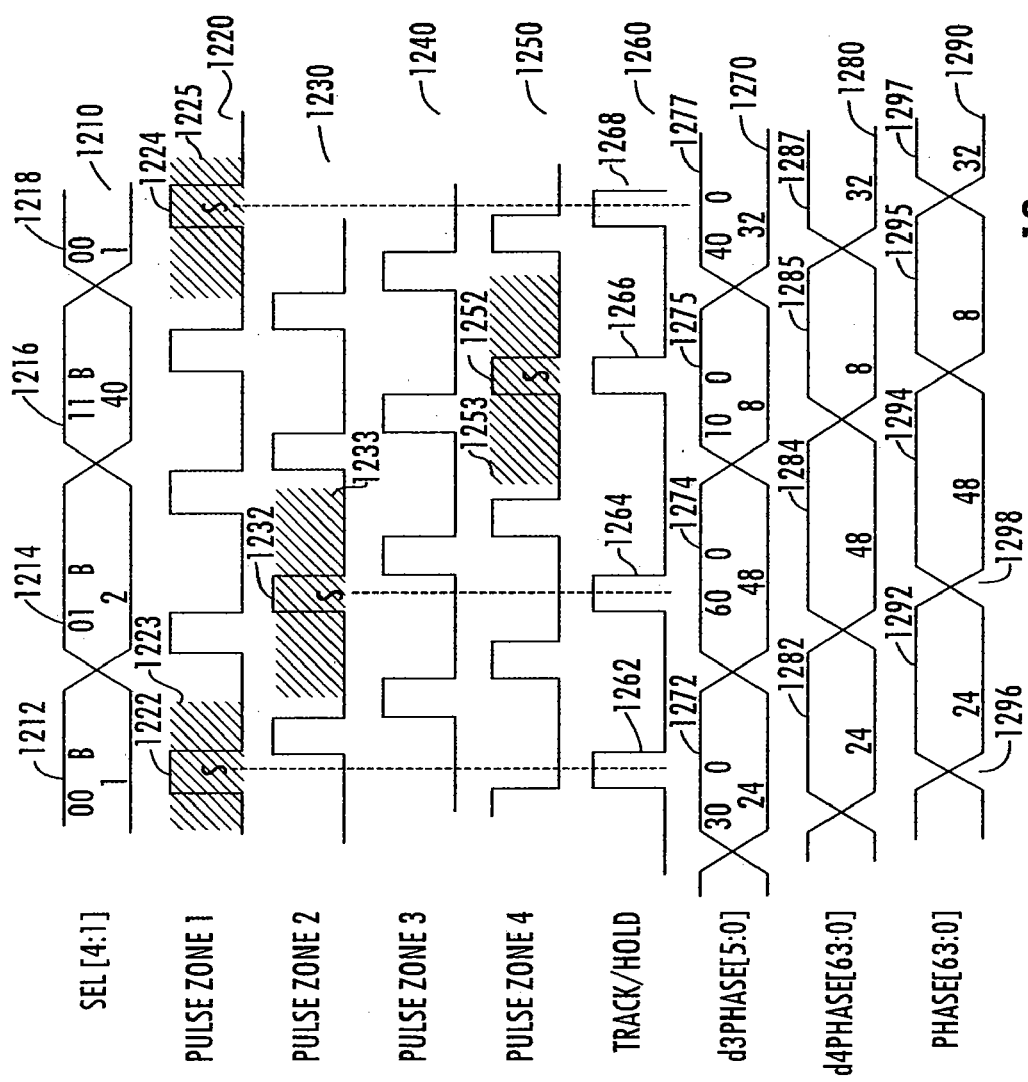
FIG. 12 is a timing diagram of a portion of the dynamic phase mixer of FIG. 10.

FIG. 12 is a timing diagram of another portion of the dynamic phase mixer of FIG. 10. Specifically, timing for the 6-bit to 64-bit decoder 1030, pulse generation 1040 and track and hold circuits 1050 is shown. The pulse generation circuit 1040 receives the select signals SEL[4:1] 1210. The pulse generation circuit 1040 also receives the 8 phase clock signals (not shown). The pulse generation circuit 1040 uses the 8 phase clock signals to generate four pulse signals with each pulse signal aligned to one of four quadrants of the NCO clock. Each of these four pulse signals are active for a quarter of a clock cycle, and each pulse signal is active during a different quadrant of the clock cycle. These signals are the pulse quadrant1 1220, pulse quadrant2 1230, pulse quadrant3 1240, and pulse quadrant4 1250. The select signals SEL[4:1] 1210 are used to select from among the pulses in the pulse quadrant signals to generate the track and hold signal 1260.

Specifically, pulse 1212 has a value of "00" binary, and accordingly pulse quadrant1 1220 is selected at this time resulting in pulse 1262 of the track and hold signal 1260. Similarly, the value of pulse 1214 for the select signals SEL[4:1] 1210 has a binary value of "01." Accordingly, pulse quadrant2 1230 is selected at this time resulting in pulse 1264 of track and hold signal 1260. In a similar fashion, pulse quadrant4 1250 and pulse quadrant1 1220 are selected later, resulting in pulses 1266 and 1268 of the track and hold signal 1260. It is important to note that the pulse quadrant signals are selected while they are low or inactive. This results in the minimum delay time for each pulse of the track and hold signal 1260. Shaded areas 1223, 1233, 1253, and 1225 indicate which of the pulse quadrant signals are selected at different times to generate the track and hold signal 1260.

The decoder 1030 receives the d3phase signal 1270 from the coarse switching circuit 1020, and decodes it into a 64 bits value d4phase 1280. D4phase 1280 is latched by the track and hold signal 1260 to generate the retimed, decoded phase signal phase1 1290.

Specifically, at time 1296, the track and hold signal 1260 is high, and the value of d4phase[63:0] 1280 at pulse 1282 is latched and provided as the phase1 1290 signal pulse 1292. Similarly the values of d4phase[63:0] 1280 at pulses 1284, 1285, and 1287 of phase1[63:0] 1290 are latched and provide as the phase 1[63:0] 1290 signal pulses 1294, 1295, and 1297.

Figure 13:
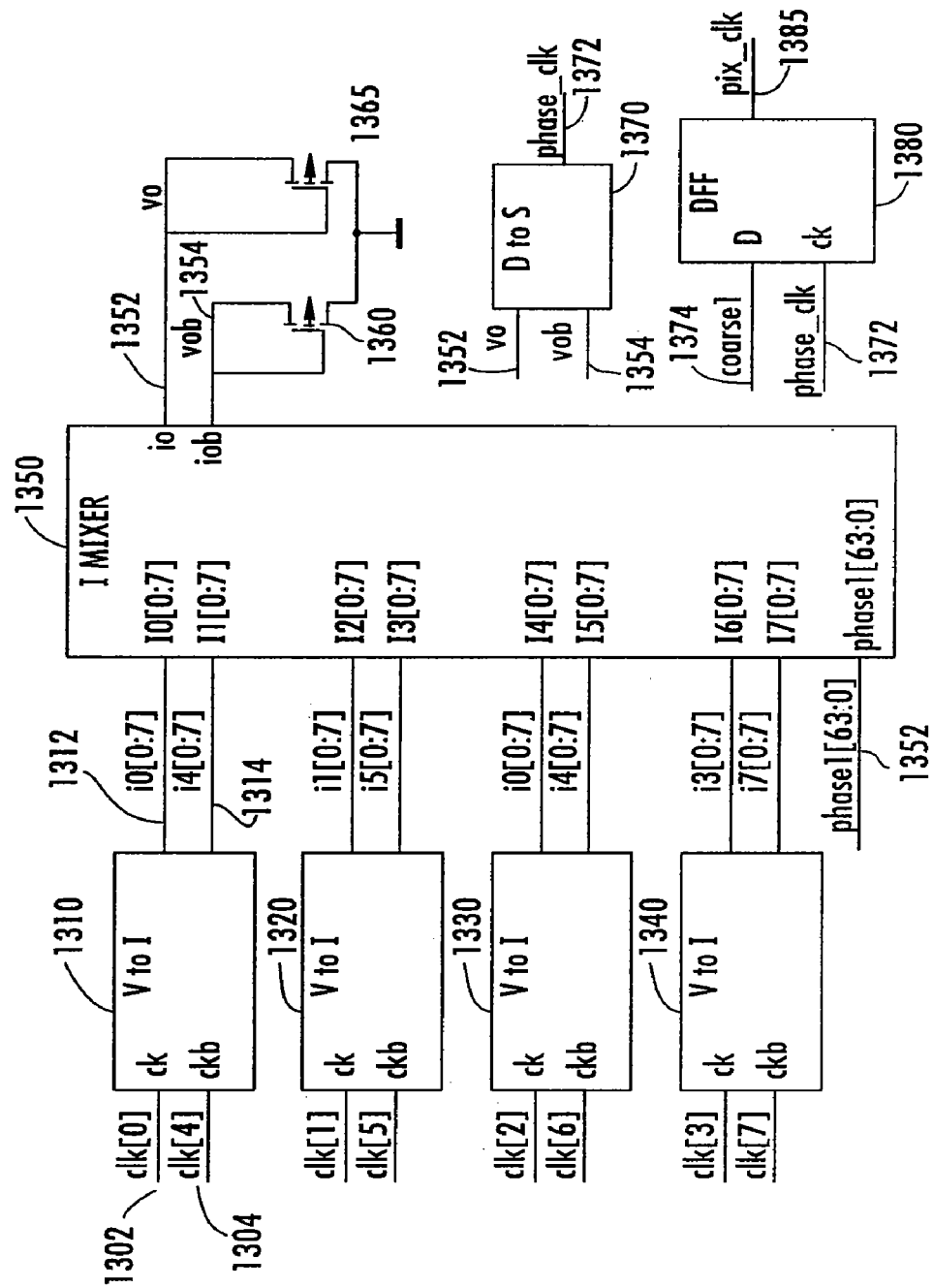
FIG. 13 is a block diagram of some of the circuitry included in the second stage of the phase mixer of FIG. 7.

FIG. 13 is a block diagram of some of the circuitry included in the second stage of the phase mixer of FIG. 7. This circuitry includes voltage-to-current converters 1310, 1320, 1330, and 1340, current mixer 1350, a current-to-voltage converter consisting of devices 1360 and 1365, and differential to single-ended conversion circuit 1370, and retiming circuit 1380.

Voltage-to-current converters 1310 receive clock signals on lines 1302 and 1304. These clock signals are spaced 180 degrees apart, effectively making them a differential clock signal. The voltage-to-current converter converts this differential clock signal to current signals on lines 1312 and 1314 and provides them to the current mixer 1350. The current mixer 1350 also receives the phase1[63:0] information on lines 1352 from the track and hold circuit as previously discussed. The 64-bit phase selection word selects 8 out of 64 currents to generate a differential current output. The current mixer 1350 provides output currents on lines 1352 and 1354 to diode-tied transistors 1360 and 1365. Differences in currents on lines 1352 and 1354 result in voltage differences on those nodes which are gained and converted to a rail-to-rail digital signal phase clock signal phase_clk on line 1372 by the differential to single-ended conversion circuit 1370. Differential to single-ended conversion circuit 1370 provides a retimed phase clock signal on lines 1372. The phase clock signal phase_clk on line 1372 has the correct timing edges specified by the 6-bit phase word. However, there may also be unwanted glitches in the phase_clk signal on line 1372 due to code switching. Accordingly, the phase_clk signal on line 1372 is used to realign the coarse1 signal on line 1374 to generate the pixel clock signal pix_clk on line 1385.

Retiming circuit 1380, shown as a D flip-flop 1380, receives the coarser signal from the first phase mixer stage on line 1374 and the phase clock signal on line 1372. The phase clock signal on line 1372 retimes the coarse1 signal 1374 and provides it as a pixel clock output pix_clk on line 1385.

Figure 14:
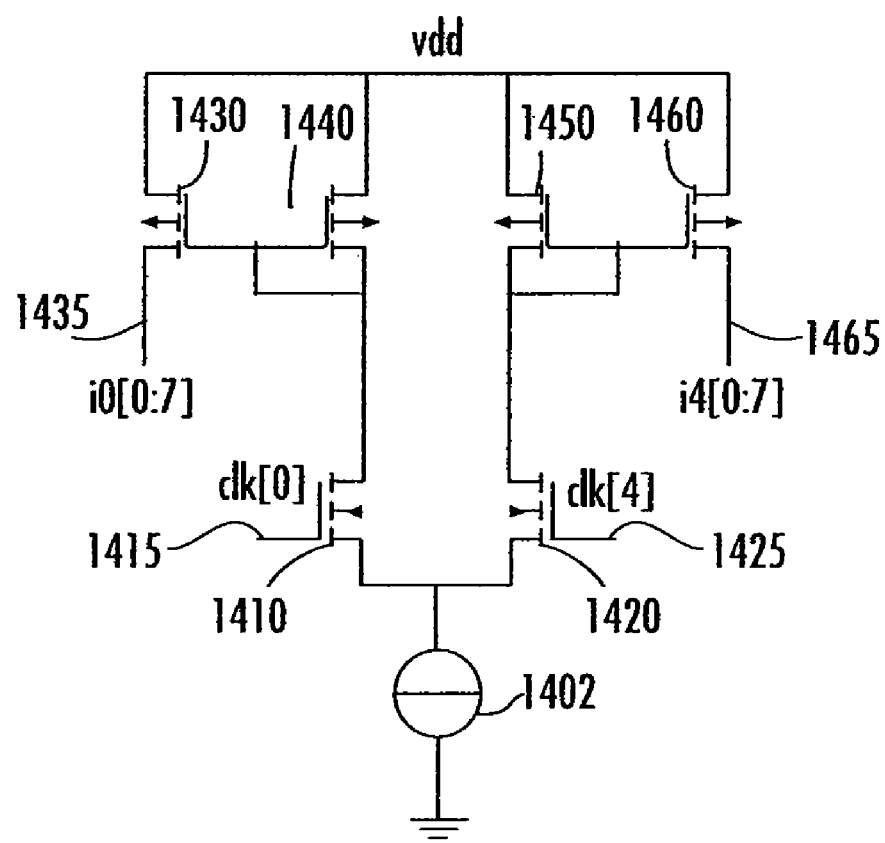
FIG. 14 is a schematic of a voltage-to-current converter that may be used as the voltage to current converter in FIG. 13.

FIG. 14 is a schematic of a voltage-to-current converter that may be used as the voltage to current converter in FIG. 13. Clock signals are received on lines 1415 and 1425 by devices 1410 and 1420. Devices 1410 and 1420 steer the current provided by current source 1402 between devices 1440 and 1450. Devices 1430 and 1460 mirror the currents in devices 1440 and 1450, and provides output currents on lines 1435 and 1465.

Figure 15:
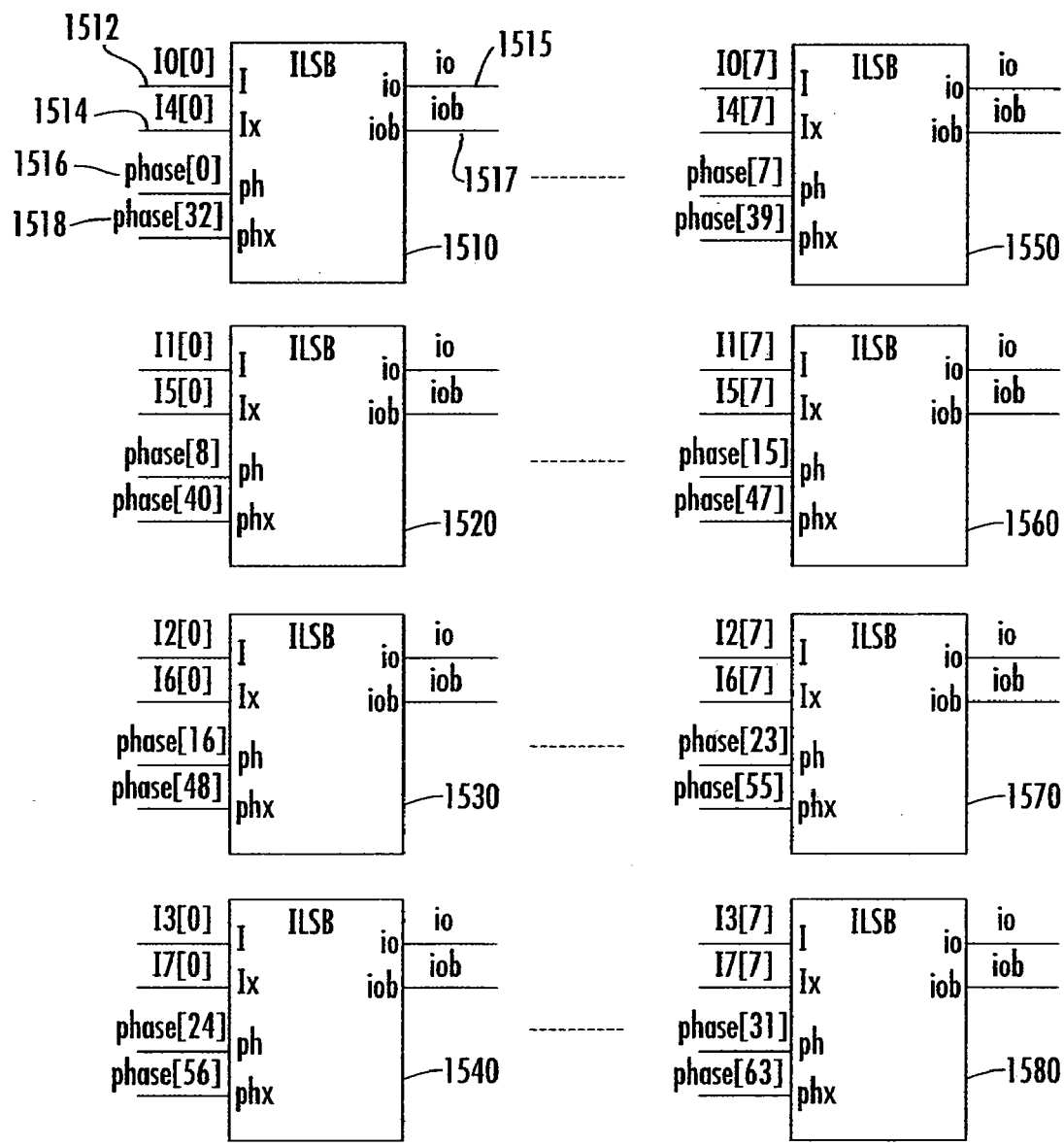
FIG. 15 is a schematic of a current mixer.

FIG. 15 is a schematic of a current mixer that may be used as the current mixer 1350 in FIG. 13. Included are a number of currents switches 1510, 1520, 1530, 1540, 1550, 1560, 1570, and 1580. In this specific embodiment, there are 64 switches, though there may be other numbers of switches used in other embodiments of the present invention.

Currents switch 1510 receives the differential currents on lines 1512 and 1514 as well as phase information on lines 1516 and 1518. The phase information on lines 1516 and 1518 are used to switch the currents 1512 and 1514 to the output lines 1515 and 1517. These two phase control signals are active low. In a specific embodiment, these signals cannot be low at the same time. Specifically, in this embodiment, only 8 adjacent phase control signals out of 64 phase control signals are low for any 6-bit phase word.

Figure 16:
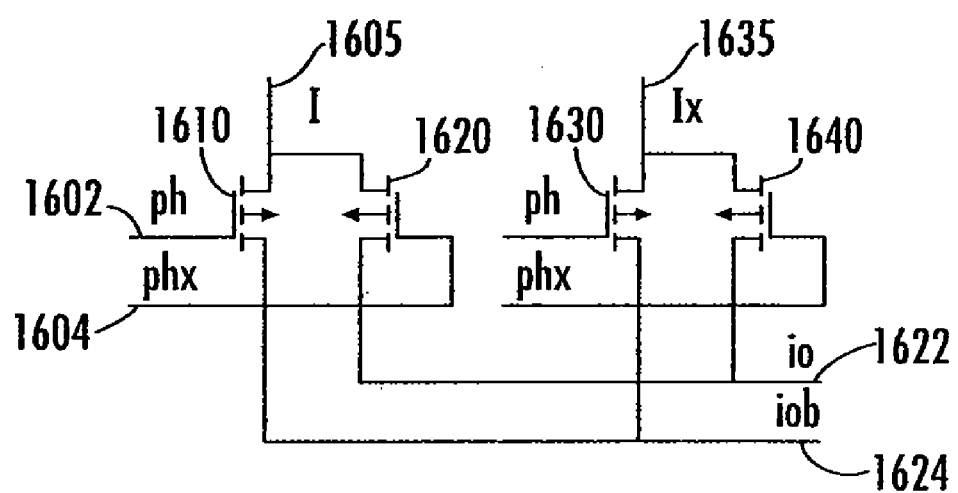
FIG. 16 is a schematic of a current switch that may be used as the current switch 1510 in FIG. 15.

FIG. 16 is a schematic of a current switch that may be used as the current switch 1510 in FIG. 15. Currents are received on lines 1605 and 1635 and are switched by the decoded phase signals on lines 1602 and 1604. These output currents are summed and provided on output lines 1622 and 1624.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

For example, in the above figures and descriptions, 6 bits of remainder signal were shown as being used. In other embodiments of the present invention, other numbers of bits of remainder signal may be used. Also, the names of various circuit blocks may be changed in other embodiments of the present invention. For example, various NCOs shown are used as phase accumulator circuits, that is a look-up table often associated as part of an NCO may not be needed. In this case, an NCO may alternately referred to as a phase accumulator. One skilled in the art will appreciate that other circuit, configuration, and name changes may be made consistent with embodiments of the present invention.

What is claimed is:

1. An integrated circuit comprising:
   a numerically controlled oscillator configured to receive an increment signal and further configured to provide an overflow signal and a remainder signal; and
   a dynamic phase mixer configured to retime the overflow signal using the remainder signal, wherein the dynamic phase mixer comprises a plurality of latches configured to latch the remainder signal, and
   wherein the remainder signal comprises a plurality of bits.

2. The integrated circuit of claim 1 wherein the dynamic phase mixer further comprises a timing circuit configured to receive at least one bit of the remainder signal and provide a control signal to the plurality of latches,
   wherein the control signal latches the remainder signal in the plurality of latches.

3. The integrated circuit of claim 2 further comprising a clock circuit configured to generate a plurality of clock signals and provide them to the dynamic phase mixer, each clock signal having a phase shifted from the other.

4. The integrated circuit of claim 3 wherein the dynamic phase mixer is further configured to mix the plurality of clock signals with the latched remainder signal to retime the overflow signal.

5. The integrated circuit of claim 4 wherein the retimed overflow signal is used as a pixel clock.

6. An integrated circuit comprising:
   a phase detector having a first input for receiving a reference signal;
   a numerically controlled oscillator coupled to the phase detector and having an overflow output and a remainder output;
   a phase error correction circuit coupled to the numerically controlled oscillator and having an output wherein the phase error correction circuit comprises:
   a coarse phase error correction stage having first input coupled to the overflow output of the numerically controlled oscillator, a second input coupled to the remainder output of the numerically controlled oscillator, and a coarse phase error corrected overflow output; and
   a fine phase error correction stage having a first input coupled to the coarse phase error corrected overflow output of the coarse phase error correction stage and a second input coupled to the remainder output of the numerically controlled oscillator; and
   a divider coupled between the phase error correction circuit and the phase detector.

7. The integrated circuit of claim 6 wherein the phase detector compares the relative phase of an output of the divider and the reference signal.

8. The integrated circuit of claim 7 further comprising a clock generation circuit coupled to the numerically controlled oscillator, wherein the clock generation circuit generates a clock signal,
wherein the numerically controlled oscillator receives a phase increment signal, and accumulates the phase increment signal once each clock cycle of the clock signal.

9. The integrated circuit of claim 8 wherein the clock generation circuit further provides a plurality of clock signals, each phase shifted from the other.

10. The integrated circuit of claim 9 wherein the phase error correction circuit mixes the remainder signal with the plurality of clock signals to retime the overflow signal.

11. The integrated circuit of claim 10 wherein the retimed overflow signal is used as a pixel clock.

12. The integrated circuit of claim 11 wherein the reference signal is a horizontal synchronizing signal for a monitor.

13. The integrated circuit of claim 6 wherein the fine phase error correction stage comprises a plurality of current switches controlled by the remainder output of the numerically controlled oscillator.

14. A method of providing a clock signal comprising:
providing a phase increment signal;
accumulating the phase increment signal;
each time the accumulated phase increment signal reaches a first threshold, toggling an overflow signal; and
using the accumulated phase increment signal to retime the overflow signal,
wherein the phase increment signal is accumulated each cycle of a clock, and
wherein the overflow signal is retimed in two stages comprising:
during the first stage, retiming the overflow signal to within a first duration; and
during the second stage, retiming the overflow signal to within a second duration, the second duration shorter than the first duration.

15. The method of claim 14 further comprising:
latching the accumulated phase increment signal using a portion of the phase increment signal.

16. The method of claim 15 further comprising:
decoding the latched accumulated phase increment information;
delaying the clock signal to generate a plurality of phase shifted clock signals; and
mixing the decoded accumulated phase increment information with the plurality of phase shifted clock signals.

17. The method of claim 16 wherein the retimed overflow signal is used as a pixel clock in a display system.

18. The method of claim 17 wherein the display system is selected from the group consisting of a flat panel display, television, and projector.

19. An integrated circuit comprising:
an NCO configured to receive increment information and provide an overflow signal and a remainder signal; and
a dynamic phase mixer configured to retime the overflow signal using the remainder signal to generate a pixel clock wherein the dynamic phase mixer comprises:
a first stage to provide a coarse phase-error correction to the overflow signal; and
a second stage to provide a fine phase-error correction to the coarse corrected overflow signal,
wherein the NCO and dynamic phase mixer operate open loop.

20. The integrated circuit of claim 19 wherein the second stage of the dynamic phase mixer comprises a plurality of current switches controlled by the remainder signal.

* * * * *